(12) United States Patent
Thakre et al.

(10) Patent No.: US 11,018,624 B2
(45) Date of Patent: May 25, 2021

(54) CONNECTOR FOR JOINING PHOTOVOLTAIC COMPONENTS

(71) Applicant: DOW GLOBAL TECHNOLOGIES LLC, Midland, MI (US)

(72) Inventors: Piyush R. Thakre, Midland, MI (US); Abhijit A. Namjoshi, Midland, MI (US); Jay M. Tudor, Goodrich, MI (US); Joseph A. Langmaid, Caro, MI (US); Keith L. Kauffmann, Ypsilanti, MI (US); Leonardo C. Lopez, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 276 days.

(21) Appl. No.: 15/526,483

(22) PCT Filed: Aug. 3, 2015

(86) PCT No.: PCT/US2015/043385
§ 371 (c)(1),
(2) Date: May 12, 2017

(87) PCT Pub. No.: WO2016/076926
PCT Pub. Date: May 19, 2016

(65) Prior Publication Data
US 2017/0317644 A1    Nov. 2, 2017

Related U.S. Application Data

(60) Provisional application No. 62/079,157, filed on Nov. 13, 2014.

(51) Int. Cl.
*H02S 40/36*    (2014.01)
*H01R 13/506*    (2006.01)
(Continued)

(52) U.S. Cl.
CPC ........ *H02S 40/36* (2014.12); *H01L 31/02008* (2013.01); *H01R 13/506* (2013.01);
(Continued)

(58) Field of Classification Search
CPC ... H01L 31/02008; H02S 40/36; H02S 20/25; H01R 13/5025; H01R 13/506; H01R 13/562; H01R 13/582
See application file for complete search history.

(56) References Cited

U.S. PATENT DOCUMENTS 7,387,537 B1    6/2008 Daily et al.
7,442,077 B2    10/2008 Peress et al.
(Continued)

FOREIGN PATENT DOCUMENTS

CN    101584050 A    11/2009
CN    201528611 U    7/2010
(Continued)

OTHER PUBLICATIONS

Written Opinion of the International Preliminary Examining Authority dated Sep. 28, 2016 for Application No. PCT/US2015/043385.
(Continued)

*Primary Examiner* — Christina Chern

(57) ABSTRACT

A photovoltaic assembly comprising: (a) at least two photovoltaic components that are adjacent to each other, each photovoltaic component comprising: (i) a partial connector channel in communication with a partial connector channel in an adjacent photovoltaic component and (ii) one or more connector receptors; (b) a connector located at least partially
(Continued)

in the partial connector channel of the photovoltaic component and at least partially in the partial connector channel of the adjacent photovoltaic component so that the connector connects the photovoltaic component to the adjacent photovoltaic component, the connector comprising: a housing having: (1) a top housing and (2) a bottom housing, wherein the top housing and the bottom housing each include a first end and a second end; one or more flexible electrical conductors that extend from the first end to the second end; wherein the top housing and the bottom housing each include one or more mechanical flexing regions that allow the housing to mechanically flex.

10 Claims, 7 Drawing Sheets

(51) Int. Cl.
*H02S 20/25* (2014.01)
*H01R 13/56* (2006.01)
*H01L 31/02* (2006.01)
*H01R 13/502* (2006.01)
*H01R 13/58* (2006.01)

(52) U.S. Cl.
CPC ....... *H01R 13/5025* (2013.01); *H01R 13/562* (2013.01); *H01R 13/582* (2013.01); *H02S 20/25* (2014.12); *Y02B 10/10* (2013.01); *Y02E 10/50* (2013.01)

(56) References Cited

U.S. PATENT DOCUMENTS

| 8,414,308 | B1 | 4/2013 | Meyers |
| 2010/0105238 | A1 | 4/2010 | Good |
| 2010/0258157 | A1 | 10/2010 | Arai |
| 2010/0311262 | A1 | 12/2010 | Cours |
| 2011/0183540 | A1 | 7/2011 | Keenihan et al. |
| 2011/0220183 | A1 | 9/2011 | Mills et al. |
| 2012/0118349 | A1 | 5/2012 | Keenihan et al. |
| 2014/0000709 | A1 | 1/2014 | Langmaid et al. |
| 2016/0156307 | A1 | 6/2016 | Lopez et al. |

FOREIGN PATENT DOCUMENTS

| JP | 2000133830 A | 5/2000 | |
| JP | 2005072101 | 3/2005 | |
| WO | 2009/137347 | 11/2009 | |
| WO | 2012/083337 | 6/2012 | |
| WO | WO 2015/009362 | * 1/2015 | .......... H01L 31/048 |
| WO | 2012/154307 | 11/2015 | |

OTHER PUBLICATIONS

International Search Report and Written Opinion dated Oct. 15, 2015 for Application No. PCT/US2015/043385.
Co-Pending U.S. Appl. No. 14/898,608, filed Dec. 15, 2015 published on Jun. 2, 2016 as US2016/0156307.

* cited by examiner

CONNECTOR FOR JOINING PHOTOVOLTAIC COMPONENTS

FIELD

The present teachings generally relate to an improved connector that electrically connects two adjacent photovoltaic components and includes one or more mechanical flexing regions that allows for thermal expansion and movement of the two adjacent photovoltaic components relative to each other.

BACKGROUND

Typically, photovoltaic arrays are placed in an outdoor location so that the photovoltaic arrays are exposed to sunlight. The components of the photovoltaic array are subjected to varying conditions such as wind, rain, snow, ice, heat, and direct sunlight. The changes in temperature, humidity, and precipitation may cause the components of the photovoltaic array to expand, contract, move, or a combination thereof. Further, individual photovoltaic components making up the photovoltaic array may be directly connected to a support structure such as a roof of house or a building. The support structure including the photovoltaic components may expand, contract, move, or a combination thereof due to environmental changes, a mass, force or displacement being applied to the photovoltaic components, a mass, force or displacement being applied to the support structure, or a combination thereof such that stress and/or strain may be put on the connection between the two or more photovoltaic components, a terminal for connection of the photovoltaic components, or both. This strain may cause the connector to be dislocated from one or both of the photovoltaic components, a connector to be broken, a terminal to be broken, may allow fluid to penetrate into the connector, or a combination thereof so that less than all of the photovoltaic modules in the photovoltaic array produce power. Furthermore, if a connector, a photovoltaic component, or both fails and ceases to work and needs to be replaced the connectors may increase the length of time required to change the connector, the photovoltaic component, or both.

Examples of some known connectors may be found in U.S. Pat. Nos. 7,387,537; 7,442,077; and 8,414,308; U.S. Patent Application Publication No. 2010/0258157 and 2014/0000709; Japanese Patent Application No. JP2005072101; and International Patent Application Nos. WO2009/137347 and WO2012/083337 all of which are incorporated by reference herein for all purposes.

It would be attractive to have a connector that electrically connects two or more adjacent photovoltaic components and provides a flexible connection so that the two or more adjacent photovoltaic components can move relative to each other while maintaining an electrical connection without the complexity of loose wires. It would be attractive to have a connector that is movable within a plane and substantially prevents movement out of the plane with the two adjacent photovoltaic components so that the electrical connection is maintained and the integrity of the connector, the terminals of the two or more photovoltaic components, or both are maintained. What is needed is a quick release connector that may be disconnected from all of the two or more photovoltaic components without damage to the photovoltaic components, the connector, or both and without undue manipulation of the connector, the photovoltaic components, or both.

SUMMARY

The present teachings meet one or more of the present needs by providing a connector that extends between two photovoltaic components and allows for movement of the photovoltaic components relative to one another. Each of the connectors includes one or more mechanical flexing regions. The mechanical flexing regions may allow for in plane movement of ends of the connector. The mechanical flexing regions may prevent out of plane movement of ends of the connector. The mechanical flexing regions may be integrally formed in the connector. The mechanical flexing regions may be a part that is added to the connector. The connector may be free of flexibility outside of the mechanical flexing regions.

One possible embodiment of the present teachings include: a photovoltaic assembly comprising: (a) at least two photovoltaic components that are adjacent to each other, each photovoltaic component comprising (i) a partial connector channel in communication with a partial connector channel in an adjacent photovoltaic component and (ii) one or more connector receptors; (b) a connector located at least partially in the partial connector channel of the photovoltaic component and at least partially in the partial connector channel of the adjacent photovoltaic component so that the connector connects the photovoltaic component to the adjacent photovoltaic component, the connector comprising: (i) a housing having: (1) a top housing and (2) a bottom housing, wherein the top housing and the bottom housing each include a first end and a second end; (ii) one or more connection ports at the first end; (iii) one or more connection ports at the second end; and (iv) one or more flexible electrical conductors that extend from the one or more connection ports at the first end to the one or more connection ports at the second end; wherein the top housing and the bottom housing each include one or more mechanical flexing regions that allow the housing to mechanically flex.

The present teachings provide a connector that electrically connects two or more adjacent photovoltaic components and provides a flexible connection so that the two or more adjacent photovoltaic components can move relative to each other while maintaining an electrical connection without the complexity of having loose wires. The present teachings provide a connector that is movable within a plane and substantially prevents movement out of the plane with the two adjacent photovoltaic components so that the electrical connection is maintained and the integrity of the connector, the terminals of the two or more photovoltaic components, or both are maintained. The present connector provides a quick release connector that may be disconnected from all of the two or more photovoltaic components without damage to the photovoltaic components, the connector, or both and without undue manipulation of the connector, the photovoltaic components, or both.

DETAILED DESCRIPTION

Figure 1:
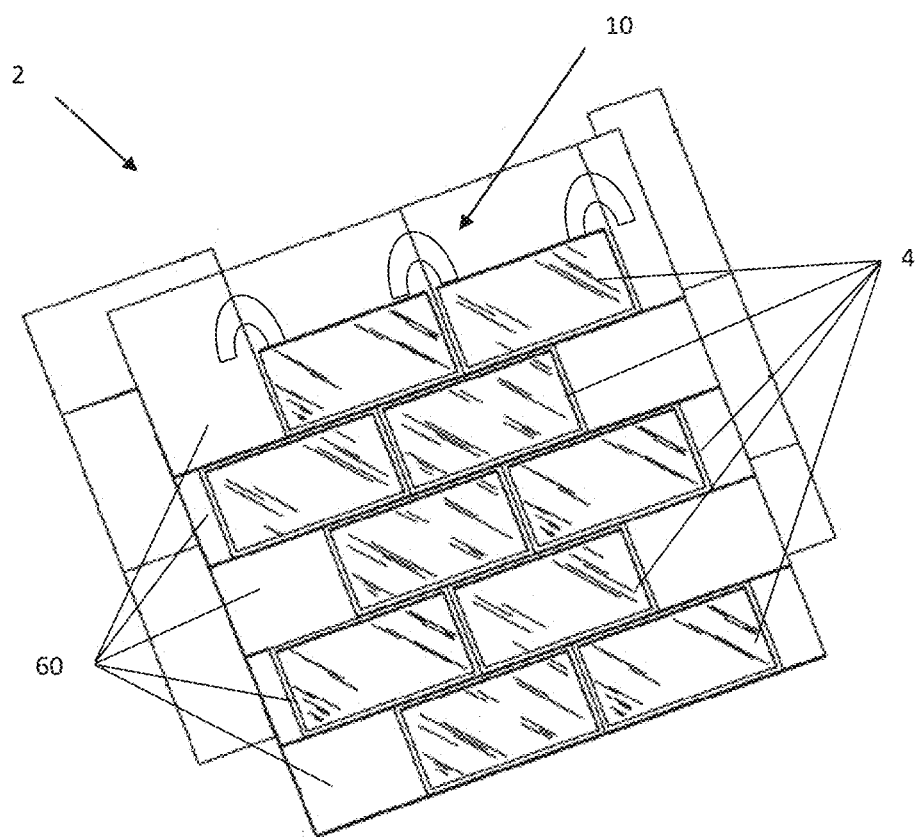
FIG. 1 illustrates a top perspective view of a photovoltaic array.

The explanations and illustrations presented herein are intended to acquaint others skilled in the art with the teachings, its principles, and its practical application. Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

A plurality of photovoltaic modules and/or photovoltaic components of the teachings herein are combined together to form a photovoltaic array. The photovoltaic array collects sunlight and converts the sunlight to electricity. Generally, each of the photovoltaic modules may be individually placed in a structure that houses all of the photovoltaic modules forming all or a portion of a photovoltaic array (sometimes referred to as a solar array). The photovoltaic modules of the teachings herein may be used with a housing that contains all of the individual photovoltaic modules that make up a photovoltaic array. Preferably, the photovoltaic array taught herein is free of a separate structure that houses all of the photovoltaic modules that make up a photovoltaic array. More preferably, each individual photovoltaic module may be connected directly to a structure and each of the individual photovoltaic modules is electrically connected together so that a photovoltaic array is formed (i.e., is a building integrated photovoltaic (BIPV)). Each of the photovoltaic components, and preferably each row of photovoltaic component in the photovoltaic array may be adjacent to each other in a first direction. For example, if a photovoltaic array includes three rows of photovoltaic components and each row includes 5 photovoltaic components each of the rows and photovoltaic components within the rows may extend along a first direction. The first direction may be aligned with the slope of a roof. Preferably, the first direction is a transverse direction (i.e., perpendicular to the slope of the roof). A portion of each of the photovoltaic modules may overlap a portion of an adjacent photovoltaic module, an adjacent photovoltaic component, or both forming a shingle configuration and/or a double overlap configuration on a support structure so that the photovoltaic modules may be used as roofing shingles. The photovoltaic components and particularly a photovoltaic module may be made of two or more discrete components that are connected together. Preferably the photovoltaic component includes at least a base plate.

The plurality of photovoltaic components and preferably each of the base plates may be connected to the connection surface by any fastener that has sufficient strength to withstand environmental conditions and form a secure connection. The plurality of base plates may be connected to a connection surface with a mechanical fastener, an adhesive, an interlocking connection with an adjacent photovoltaic module, or a combination thereof. The fasteners may be a screw, nail, bolt, staple, or a combination thereof. The adhesive may be epoxy based, silicone based, acrylic based, urethane based, polyamide based, polyolefin based, polyester based, a crosslinked adhesive, a thermoplastic adhesive, a pressure sensitive adhesive, a hot melt adhesive, a block copolymer, a segmented copolymer, a one part adhesive, a multi-part adhesive, a natural adhesive, a synthetic adhesive, or a combination thereof. If an adhesive is used, preferably an adhesive is used so that the photovoltaic laminate can be removed from the base plate without damaging the base plate, the photovoltaic laminate, or both. Although not preferred an adhesive and a mechanical fastener may be used to connect the photovoltaic laminate to the base plate, the photovoltaic module to a connection surface, or both. The adhesives discussed herein may connect an integrated frame to a photovoltaic laminate. The fasteners may connect a base plate, a base plate with a photovoltaic laminate (herein after a pv laminate), or both to a connection structure.

The base plate may function to provide roofing functions. The base plate may function to connect a photovoltaic laminate (hereinafter pv laminate) to a connection surface (e.g., a roof). The base plate may function to allow for decoupled expansion and contraction of the pv laminate relative to the base plate or vice versa. The base plate may function to allow for removal, replacement, repair, or a combination thereof of the pv laminate without removal of the entire pv module from the connection surface. The base plate may function to protect all or a portion of the pv laminate. The base plate may connect the pv laminate to a connection surface. The base plate may protect one or more connectors. The base plate may include one or more features to assist in forming a connection with one or more connection devices, one or more pv laminates, or both. The base plate may connect to a pv laminate forming an active portion. The base plate may include an overlap portion and a support portion. The overlap portion is a portion that is overlapped by an adjacent photovoltaic module so that a shingling effect is created. The support portion is a portion that is connected to a pv laminate, receives a pv laminate, or both.

The one or more and preferably the plurality of pv laminates may be configured in any manner so that each of the plurality of photovoltaic modules may be electrically connected. The pv laminates may include a protective cover (e.g., a glass cover) and pv cells (e.g., an electrical circuit). The pv laminate assembly may include one or more of the following components: a forward protective layer, a rearward protective layer, a reinforcement, a photovoltaic cell, a peripheral moisture sensitive edge seal, one or more internal protecting layers, dielectric materials as may be needed to manage the penetration of electrical components outside the laminate, attached connectors and wiring boxes, connector support structures including junction boxes, integrated low profile connectors, encapsulants, moisture resistant back sheets that may optionally include metallized sub layers, or a combination thereof. Components and layers of the photovoltaic module are contemplated herein that may be used with the reinforcement taught herein especially those components, layers, and/or materials disclosed in Paragraph Nos. 0048-0053 of U.S. Patent Application Publication No. 2012/0118349, and Paragraph Nos. 0027-0038 and FIGS. 2A and 2B 2011/0220183, both of which are expressly incorporated herein by reference in their entirety for all purposes and especially as to components, layers, and/or materials for active portions that may be used in conjunction with the reinforcement and photovoltaic module discussed herein. Each of the individual photovoltaic modules may be electrically connected to an adjacent photovoltaic module by one or more connectors as are taught herein. Each of the pv laminates may include one or more conductors that extend through and/or are connected to a photoactive portion that converts sunlight to electricity. The pv laminate may be made of any material so that when sunlight is directed on the active portion the sunlight in converted into electricity. The pv laminate may be made of one or more photovoltaic cells having a photoactive portion. Preferably, the pv laminate may be made of a plurality of photovoltaic cells. The photovoltaic cells may be made of any material that assists in converting sunlight into electricity. The photovoltaic cells may be of any type and material known in the art. Materials and/or combinations of materials are contemplated herein especially those compositions disclosed in paragraph 0054 of U.S. Patent Application Publication No. 2012/0118349, which is incorporated herein by reference as to materials for the active portion. The photovoltaic cells of the photovoltaic laminate may be arranged in parallel, series, mixed series-parallel, and/or may be provided in independent circuits. The photovoltaic laminate may be a combination of layers and may form a pv laminate assembly. The one or more conductors may be a single continuous piece that is square, a single continuous piece that is round, a single strand, multiple strands, multiple strands that are twisted together, made of copper, made of aluminum, a ribbon, a positive bus bar, a negative bus bar, a wire, a part of an integrated flashing piece, or a combination thereof (e.g., electrical circuitry). The one or more conductors may be joined to one or more connectors. Preferably of the conductors of the pv laminate are interconnected and connect with two connectors that extend from the pv laminate. The electrical circuitry may be sealed within the pv laminate. The pv laminate may be joined to and/or adjacent to any photovoltaic component as is taught herein.

The photovoltaic components of the photovoltaic array may function to collect sunlight to generate electricity, any component that transfers power throughout the photovoltaic array, photovoltaic module, any component that assists in generating energy from sunlight, an integrated flashing piece, an inverter connection, an inverter, a connector, or a combination thereof. Preferably, the photovoltaic components are the photovoltaic module, an integrated flashing piece, or both. More preferably, when connecting two photovoltaic components at least one of the photovoltaic components is a photovoltaic module. The photovoltaic components may be connected together by a connector that is discrete from each photovoltaic component, integrally connected to one photovoltaic component and separate from another photovoltaic component, or both. Preferably, the photovoltaic components include one or more connector receptors, and preferably two or more connector receptors so that two or more adjacent and/or juxtaposed photovoltaic components may be electrically connected together. For example, the two adjacent photovoltaic components may be located in close proximity to each other (i.e., a spacer, gap, shim, or the like may be located between the two adjacent photovoltaic components) so that a connector may span between and electrically connect the two adjacent photovoltaic components.

The one or more connector receptors may function to electrically connect a photovoltaic laminate, a photovoltaic module, a photovoltaic component, or a combination thereof to another photovoltaic component. The one or more connector receptors may be any feature and/or device on a photovoltaic component where a connector may electrically connect the photovoltaic component to one or more adjacent photovoltaic components. The connector receptors may be configured on a side of the photovoltaic component, on an edge of the photovoltaic component, a surface on virtually any side of the photovoltaic component, outside of an active area of the photovoltaic component, or a combination thereof. Preferably, the connector receptors may be located on a side of a photovoltaic component in an edge region of each photovoltaic component. More preferably, the connector receptors may be located within an edge region and on a side of the photovoltaic component that faces the sun, the installer, the connection structure, or a combination thereof within a connector channel when joined to a support structure. The connector receptors may be located at an end of a connector channel, may be a terminal end of a connector channel, or both. The connector receptors of each photovoltaic module may be generally oriented in the same direction; the connector receptors may be generally oriented along a line (i.e., pointed away from each other in the same plane); the connector receptors of one photovoltaic component may be located alongside a connector receptor of another connector receptor; the connector receptors may be staggered; angled towards each other, away from each other; or a combination thereof. Preferably, the connection receptors do not point towards each other in a transverse direction (i.e., are not located perpendicular to the slope of a roof so that two adjacent connection receptors face each other). The connection receptors may be parallel, non-parallel, non-coplanar, coplanar, have an intersecting angle (e.g., a line extending from a connection point of the connection receptors if extended, will intersect a line extending from another connection point); have a diverging angle (i.e., a line extending from a connection point of the connection receptor is extended the lines will never intersect); be located linearly along the photovoltaic components, or a combination thereof. Preferably, the connection receptors are shaped and oriented so that the connection receptors may be interfaced with the connector assembly substantially simultaneously. The connector receptors may be parallel and face in the same direction, parallel and facing the opposite direction, non-parallel generally facing the opposing photovoltaic component; non-parallel generally facing away from the opposing photovoltaic component, or a combination thereof. The connector receptors may include one or more connection points where a connector may plug so that power is transferred from one photovoltaic component to another photovoltaic component.

The one or more connection points may function to create an electrical connection. The one or more connection points may be a female portion, a male portion, or a combination of both that forms an electrical connection with a connector for transporting power between or through photovoltaic components. The connection points may be any component that extends into a connection port, around a connection port, connects to a terminal, or a combination thereof. Preferably, the connection points may be an opposite structure to that of the connector such that the connection points extend into the connector, a portion of the connector extends into the connection points, or a combination of both. More preferably, the connection points are all male or all female. The one or more connection points may point in any direction so that the connector may form an electrical connection for transferring power from one photovoltaic component to another photovoltaic component. Preferably, the one or more connections points of each of the photovoltaic components point in the same direction (e.g., all of the connection points are directed up the slope of the roof and/or down the slope of the roof). More preferably, the one or more connection points face along the slope of the roof line (i.e., longitudinal direction) so that movement of the one or more photovoltaic components along the roof (i.e., transverse direction) cannot disconnect the connector from the one or more connection points. The one or more connection points of a first photovoltaic component may be located side by side with the one or more connection points of an adjacent photovoltaic component, the connection points may be juxtaposed, the connection points may be staggered, the connection points may be offset, the connection points may be coplanar, the connection points may extend at an angle towards each other, at an angle away from each other, or a combination thereof. The one or more connection points may be on a surface of the photovoltaic component. Preferably, the one or more connection points are located within a partial connector channel or a complete connector channel within a photovoltaic component. For example, the photovoltaic component may include a top surface forming a plane and the connection points of the connector receptors may be located below the plane, in a connector channel, or both.

The connector channel may be any part of the photovoltaic component where a connector, a different photovoltaic component, or both may be placed so that all or a portion of the connector, the different photovoltaic components, or both are planar with an outer surface of the photovoltaic component, located below an outer surface of the photovoltaic component, located below a plane of the outer surface and covered, or a combination thereof. The connector channel may be any part of the photovoltaic component where a portion of the photovoltaic component is removed, a depression is formed within the photovoltaic component, a molded depression is formed that extends below an outer surface of the photovoltaic component, or a combination thereof. Preferably, each photovoltaic component includes at least a partial connector channel and the partial connector channel is located in an edge region of the photovoltaic component. More preferably, the partial connector channel or the complete connector channel (e.g., when two photovoltaic components are connected) may be located outside of the active portion of the photovoltaic component (i.e., the portion that is exposed to sunlight). Most preferably, each partial connector channel of each photovoltaic component when put together may form a complete connector channel and the connector may fit within the complete connector channel and electrically connect, physically connect, or both the two adjacent photovoltaic components. The connector channel may be configured so that the connector channel may be covered and so that a substantially fluid tight seal is formed that protects the contents within the connector channel. The connector channel may include one or more latching mechanisms.

The one or more latching mechanisms may be any device and/or feature that forms a physical connection with one or both ends of the connector, with one or more connection features of the connector, one or more locking features of a connector, or a combination hereof. The one or more latching mechanisms may function to join a connector to the photovoltaic component. The one or more latching mechanisms may function to create a complementary fit with a locking feature of a connector. The one or more latching mechanisms may assist in creating an electrical connection, a physical connection, or both. The one or more latching mechanisms may be a detent, a latch, a depression, a projection, a clip, a recess, a through hole, a male piece, a female piece, the like, or a combination thereof. The latching mechanism may be any device and/or feature that when connected requires a user interface and/or tool to detach the connection, produces a connection with sufficient force that a user interface and/or tool is required to detach the connection, or both. For example, a screwdriver may be required to disconnect the latching mechanism from a locking feature, or vice versa. The latching mechanism may produce a connection with sufficient force so that inadvertent disconnection is substantially prevented and/or eliminated. The latching mechanism may produce a connection with sufficient force so that partial engagement is not achieved. For example, if a user pushes the locking feature partially into contact with the latching mechanism and a connection is not achieved the locking feature and/or latching mechanism may complete the connection so that a connection is formed, the locking feature and/or latching mechanism may remove the partial connection so that no connection is formed, or both. The latching mechanism may produce a signal when a connection is formed (e.g., an audible signal, a haptic signal, the like, or a combination thereof). The latching mechanism may create a removable connection with the connector so that the connector is retained within the connector channel, but the connector may be removed upon release of the latching mechanism. The latching mechanism may cover all or a portion of the connector to form a connection; the latching mechanism may be connected to a top, bottom, side, edge, internal feature, or a combination thereof of the connector to form a connection; the latching mechanism may extend into a part of the connector; a locking feature of a connector may extend into the latching mechanism, or a combination thereof. For example, the internal feature of the connector may be a detent or a movable latch that assists in forming a mating connection between the latching mechanism and the connector. The latching mechanism may connect to a connector channel of a base plate, a base plate, or both. The latching mechanism may include one or more holes, connection points, arms, locking mechanisms, teeth, through holes, detents, or a combination thereof for forming a mechanical connection with a locking feature, a connector, or both.

The connector channel may include one or more fluid drains. The one or more fluid drains may be any part of the connector channel, the photovoltaic component, or both that allows fluid to exit the connector channel, the photovoltaic component, or both. The one or more fluid drains may be a hole, a slot, a low spot, a passage, a channel, or a combination thereof that allows fluid to flow out of the connector channel so that the connector, a connection between the connector and the photovoltaic component, or both remain substantially dry, are substantially free of contact with a standing fluid, or a combination thereof. Preferably, the fluid drains are a series of holes in the connector channel of a photovoltaic component that allow water to exit the connector channel so that the connector, the pv laminate connector, or both are not located in standing water within the connector channel.

The connector may function to electrically connect, physically connect, or both two or more adjacent photovoltaic components. The connector may function to electrically, mechanically, or both bridge a gap between two or more adjacent pv laminate connectors. The connector may function to be installed in one configuration so that positive terminals of the connector and positive terminals of the pv laminate connector are aligned and negative terminals of the connector and negative terminals of the pv laminate connector are aligned. The connector may only be installed in a single position so that the polarity of the connector aligns with a same polarity of the photovoltaic component (e.g., photovoltaic module). The connectors and the pv laminate connectors may include the same or similar features. Thus, as discussed herein any of the features of the connector may be included with the pv laminate connector (e.g., locking feature, locking tab, guide, channel, or a combination thereof). The connector functions to move with expansion, contraction, or both of one or more photovoltaic laminates, photovoltaic modules, photovoltaic components or a combination of two or more. The connector may be any shape and size so that the connector may be a quick release and/or quick attach connector. The connector may be configured so that the connector may be connected and/or removed without manipulation to any other photovoltaic components of the teachings herein. For example, the connector may be disconnected and removed and/or aligned and connected from one or more photovoltaic components without having to reorient the photovoltaic components relative to each other, the connector, or both. The connector may be any shape and size so that the connector has two adjacent connection ports that extend in the same direction so that a connection is formed between two or more photovoltaic components. The two adjacent connection ports may be coplanar, staggered, offset, side by side, may mirror the location of the connection points, or a combination thereof. The connector may have two halves and the two halves may be substantially symmetrical and/or substantially identical on two sides of a line that bisects the connector along its length. The connector may be generally "U" shaped, generally "V" shaped, generally "M" shaped, generally "W" shaped, may be generally square or rectangular with a slit that extends partially through a central region so that two discrete portions are formed; or a combination thereof. The connector may have two halves that are not symmetrical with a line that bisects the connector along its length. The connector may be generally "J" shaped, generally "S" shaped, or a combination of both. The connector may have a main body portion with ends and the main body portion may include a housing and/or be a housing.

The housing may function to protect one or more internal components. The housing may function to guide the connector into communication with a pv component connector, a pv laminate connector, or both. The housing may function to protect one or more conductors from being damaged due to repeated flexing. The housing may function to connect to one or more structures that form a connection with one or more adjacent connectors (e.g., a pv laminate connector, a pv component connector). The housing may be substantially rigid. The housing may be rigid so that the housing protects the conductors, protects the conductors from repeated movements, or both. The housing may be resistant to applied forces. The housing may resist crushing, prevent crushing, resist out of plane movement, resist in plane movement, or a combination thereof. The housing may be sufficiently strong so that when the connector is stepped on the housing resists deformation, damage, or both to the conductors extending through the housing. The housing may be made of a single piece. Preferably, the housing may be made of two or more pieces. More preferably, the housing may be made of a top housing and a bottom housing that are joined together.

The top housing may function to receive all or a portion of the conductors. The top housing may include one or more recesses and the one or more recesses may receive all or a portion of the conductors. The top housing may include a plurality of recesses. The top housing may have one or more substantially vertical walls that extend from a horizontal wall and the vertical walls may be taller than a conductor so that the conductor is protected from a force, is wholly enclosed within the housing, or both. The top housing may have one or more channels that receive the one or more conductors. The top housing may include an open space and the conductors may extend through the open space. The top housing may be a mirror image to a bottom housing, be complementary to a bottom housing, form a fixed connection to a bottom housing, receive all or a portion of a bottom housing, or a combination thereof.

The bottom housing may function to protect one or more sides of a conductor. The bottom housing may function to connect to a top housing so that a completed housing is formed. The bottom housing may include any of the features of the top housing. The bottom housing may receive all or a portion of a conductor. The bottom housing may extend into a portion of the top housing. The bottom housing may form a connection with the top housing. The bottom housing may be planar, include one or more curves, include one or more walls that extend at an angle from a planar wall, or a combination thereof. Substantially the entire bottom housing may fit within the top housing. The top housing, the bottom housing, or both may be made of the same material. Preferably, the top housing and the bottom housing may be made of a rigid material, a flexible material, include a flexible material, one homogeneous material, a combination of materials, or a combination thereof. The top housing and the bottom housing may be made of and/or include a plastic, a resin, acrylonitrile butadiene styrene (ABS), acetal, polyethylene, a low density polyethylene, a high density polyethylene, nylon 6, nylon 12, nylon 66, polybutylene terephthalate, a poly carbonate, polyethylene terephthalate, polypropylene, polyamide, polyethylene ether, polyphenylsulfone, polystyrene, polysulfone, styrene butadiene, thermoplastic vulcanizate, polyester, polyether imide, silicone, metal, fiber reinforcement, carbon black, or a combination thereof. The top housing, the bottom housing or both may include one or more flexing regions.

The one or more flexing regions may function to allow for movement of the housings. The one or more flexing regions may act as the only portion of the housing to move. For example, the flexing region may move and ends of the connector may remain static. The ends of the connector remaining static may prevent compression of the inner seal, the outer seal or both so that a fluid path is not introduced into the connector, a photovoltaic component (e.g., photovoltaic module), or both. The one or more flexing regions may be mechanical flexing regions (i.e., the material characteristics of the housing do not create the flexing region of the housing). The one or more flexing regions may be a feature created in the housing that allows a portion of the housing to move and flex. The one or more flexing regions may be located within a central portion of the housing.

Preferably, the flexing regions may be located at a mid-point of the housing (e.g., a point half way between the two ends of the housing, at a half-way point of the width, at a half-way point of the length, or a combination thereof). The flexing regions may mirror the shape of the housing. The flexing regions may extend from edge to edge of the housing. The flexing regions may be an absence of material. The flexing regions may be a weakened region in the housing. The flexing regions may include a second material, a material with elastic characteristics, or both. The flexing regions may have a different thickness when compared to the rest of the housing. Preferably, the flexing regions are located at a peak, an apex, or both of the housing. The flexing regions may include multiple mechanical devices that allow the housing to move, flex, bend, or a combination thereof. The flexing regions may allow the housing to flex in plane, out of plane, or both. Preferably, the flexing regions only allow the housing to flex in plane. The flexing regions may be located in both the top housing and the bottom housing. The flexing regions in the top housing may be a different size than the flexing regions in the bottom housing. Preferably, the flexing regions in the top housing and the bottom housing are the same shape and size. The flexing regions in the top housing and the bottom housing may align, overlap, be staggered, be offset, or a combination thereof. Preferably, the flexing regions in the top housing extend through exactly the same location as the flexing region in the bottom housing. The flexing regions may include one or more ribs, one or more spaces, one or more elastic pieces, or a combination thereof.

The one or more ribs and preferably a plurality of ribs may function to connect two halves of the housing, the connector, or both together. The one or more ribs and preferably a plurality of ribs may function to provide some resistance to movement of the housing, prevent out of plane movement of the housing, or both. The housing may include one or more ribs, two or more ribs, three or more ribs, four or more ribs, or even five or more ribs. The one or more ribs may extend between ends of the flexing region. The one or more ribs may extend from one end of a flexing region and terminate before the rib reaches a second end of the flexing region. The one or more ribs may extend at any angle within the flexing region. The one or more ribs may extend along a length (i.e., a longest dimension) of the housing. For example, if the housing is U shaped the length may be the direction beginning at one end and extending along the housing towards the second end while following the shape of the housing. The one or more ribs may extend a width (e.g., a direction perpendicular to the length) of the housing. The one or more ribs may extend diagonally from a first edge to a second edge. The one or more ribs may be straight, curved, arcuate, have a serpentine configuration, or a combination thereof. Each of the ribs may extend at an angle relative to each other. Preferably, the ribs are all parallel to each other. More preferably, the ribs are parallel to each other along the entire length. For example, if the ribs curve then all of the ribs curve at the same rate. One or more spaces may be located between each of the ribs.

The one or more spaces may function to weaken the flexing region of the housing. The one or more spaces may function to allow the housing to flex. The one or more spaces may function to allow the ribs to move, the ribs to be flexed, or both. The one or more spaces may extend all of the way through the housing (i.e., bottom housing, top housing, or both). The one or more spaces may extend from one edge of the flexing region to an opposing edge of the flexing region. The one or more spaces may begin at one edge of the flexing region and stop before reaching a second edge of the flexing region. The one or more spaces may be an open section in the housing. The one or more spaces may extend in the same direction as the ribs. Preferably, the spaces are parallel to the ribs. The one or more spaces may function to receive a material with different properties than the housing. For example, the space may receive an elastic piece that is placed within the space and the elastic material may allow the housing to have some movement but the elastic material may restrict some movement of the housing.

The elastic piece may function to restrict movement of the housing. The elastic piece may function to protect the conductors. The elastic piece may function to provide stiffness to the flexing region. The elastic piece may prevent the housing from being over flexed (i.e., flexed to a point of breaking and/or being damaged). The elastic piece may extend all of the way through the housing. The elastic piece may extend between the top housing and the bottom housing. An elastic piece may be located within the top housing and a separate elastic piece may be located within the bottom housing. The elastic piece may only prevent the housing from being moved in compression. For example, when the ends of the housing are moved towards each other the elastic piece may be compressed and prevent the ends from moving towards each other. The elastic piece may be placed in tension. For example, as the ends of the housing are moved apart the elastic piece may be stretched and movement of the ends may be restricted. The top housing, the bottom housing, or both may include one or more stops that may assist in aligning the top housing to the bottom housing, the elastic piece within the top housing and/or bottom housing, or both.

The one or more stops may function to align the top housing relative to the bottom housing. The one or more stops may function to prevent the top housing and the bottom housing from moving relative to each other, from compressing the conductors, or both. The one or more stops may extend from a vertical wall, a horizontal wall, or both of the top housing, the bottom housing, or both. The one or more stops may extend outward from a wall of the top housing, the bottom housing, or both. The one or more stops may prevent the bottom housing from extending into a recess of a top housing or vice versa. The stops may have a height and the height of the stops may be substantially the same height as the conductors or greater than the height of the conductors. The top housing, the bottom housing, or both may include one or more stops and preferably a plurality of stops. The stops may be integral with the top housing, the bottom housing, or both. The stops may be a separate piece that is added to the top housing, the bottom housing, or both. The stops may work in conjunction with one or more end locators.

The one or more end locators may function to lock a terminal cover within the housing, between the top housing and the bottom housing, or both. The one or more end locators may function to prevent a terminal cover from being removed from the housing. The one or more end locators may abut a wall of a terminal cover so that when the connector is disconnected from the pv laminate connector, a force is placed on the connector, or both the terminal cover is not pulled out of the connector. The one or more end locators may assist in locking the terminal cover within the housing. The one or more end locators may form a contact surface for one or more locking tabs of a locking feature. For example, the terminal cover may include a locking feature on two opposing surfaces and the locking features when extended into the housing may extend outward and prevent the terminal cover from being removed. The one or more end locators may include one or more chamfered surfaces that allow a locking feature, a locking tab, or both to extend into the housing. The one or more chamfered surfaces may be a one way surface. For example, the chamfered surface may allow a locking tab to extend in a first direction past the end locator and may prevent the locking tab and terminal cover from being removed from the housing in a second direction that is opposite the first direction. The one or more end locators may be located opposite one or more top locators so that the terminal cover is confined within the housing between the top locator and the end locator.

The one or more top locators may function to prevent the terminal cover from being moved into the housing, pushed into the housing, or both. The one or more top locators may function to prevent longitudinal movement, lateral movement, or both of the terminal cover. The one or more top locators may extend along one side of the terminal cover and an end locator may extend along an opposing side of the terminal cover so that a portion of the terminal cover is sandwiched therebetween. The one or more top locators may be generally "L" shaped. The one or more top locators may be larger than the end locator so that a portion of the terminal cover may extend beyond the end locator and be prevented from moving past top locator. The one or more top locators may only function to prevent movement into the housing, prevent compression of the conductors, or both. The one or more top locators may be two or more top locators. The top locators may be located on opposite sides of the housing. The one or more top locators may be located proximate to a guide, may be located at an upper end of a guide, or both The one or more guides may function to guide the terminal cover into the housing during assembly of the housing. The one or more guides may function to assist the terminal cover in seating within the housing. The one or more guides may be a recess that receives a portion of the terminal covers. The one or more guides may be a back wall, a top wall, or both of the top housing, the bottom housing, or both. The one or more guides may be a surface of the housing that the terminal cover slides upon as the terminal cover is inserted into the housing. The one or more guides may assist the terminal cover in seating between the end locator and the top locator. The one or more guides may be located proximate to a channel in the housing.

The one or more channels may function to allow the terminal cover to only be placed in the housing in a single position. The one or more channels may function to connect the top housing to the bottom housing. The one or more channels may create a friction fit between the top housing and the bottom housing. The one or more channels may create a tongue and groove connection between the top housing and the bottom hosing. The one or more channels may function to receive a portion of the terminal cover so that the terminal cover is properly seated within the housing. The top housing, the bottom housing, or both may each include one or more channels or a plurality of channels. The one or more channels may allow the terminal cover to slide into the housing. The one or more channels may be a track and/or recess that a portion of the terminal cover extends into and aligns the terminal cover as the terminal cover is extended into the housing. The one or more channels may receive a portion of the terminal cover and the channels may be located on one side of the housing so that locating features of terminal cover may need to be aligned with the channel so that the terminal cover may be inserted into the housing. The one or more channels may assist the terminal cover from aligning with the terminal ends of the conductors so that conductors are aligned within the terminal cover (i.e., forming terminals). The one or more channels may receive one or more ridges.

The one or more ridges may function to form a connection with a channel so that the top housing and the bottom housing are fixedly connected together. The one or more ridges may project out from a side and/or edge of the top housing, bottom housing, or both. The one or more ridges may be a tongue that extends from a portion of the housing. Preferably, the ridge extends from bottom housing. The one or more ridges may be complementary to one or more channels. The one or more ridges may form a snap fit, a friction fit, or both with a channel. The one or more ridges may slide into a channel. The one or more ridges may be part of the bottom housing, the top housing, the terminal cover, or a combination thereof. The one or more ridges and one or more channels may be substantially the same length. The one or more ridges may work in conjunction with the one or more guides, one or more end locators, one or more top locators, or a combination thereof.

The guides, end locators, top locators, or a combination thereof may all work in conjunction so that the terminal cover and the conductors are aligned and the conductors extend into the terminal cover. The guides, end locators, top locators, or a combination thereof may guide the conductors into the terminal cover so that there is a proof that the conductors are properly seated within the terminal cover. The terminal covers may be spaced apart so that an open section extends between the terminal covers.

The one or more open sections may function to separate ends of the connector, the terminal covers or both. The one or more open sections may function to provide flexibility between the ends of the connector. The one or more open sections may be an absence of material. The one or more open sections may be a space between sides of the connector. The one or more open sections may be located over a space between two adjacent photovoltaic components. The one or more open sections may create two discrete ends.

The ends of the connector may extend in the same direction, at an angle towards each other, at an angle away from each other, or a combination thereof. Preferably, the connector includes at least two discrete ends that project in the same direction. More preferably, the connector includes two discrete ends that project in the same direction and are movable within a plane (e.g., towards and away from each other or left and right); out of plane (e.g., up and down); a combination of directions therebetween (e.g. diagonally), or a combination thereof. For example, the two discrete ends are located within substantially the same plane and extend substantially in the same direction to form a connection between two adjacent photovoltaic components (e.g., two photovoltaic modules, one photovoltaic module and an integrated flashing piece). Preferably, the connector is shaped and oriented so that the connection ports at the discrete ends of the connector may be terminated substantially simultaneously.

The one or more connection ports may function to form an electrical connection, a mechanical connection, or both with a connection point of a photovoltaic component. The one or more connection ports may be any device and/or feature that may form a connection with one or more photovoltaic components. Preferably, the one or more connection ports are an end of each of the ends of the connector that come into contact with the photovoltaic components so that a connection is formed between the two adjacent photovoltaic components. The one or more connection ports may be an opening in the connector, the terminal covers, or both that allows a portion of the photovoltaic component to enter the connector forming a connection, a portion of the connector to extend into a portion of the photovoltaic component, or a combination of both. The one or more connection ports may be an opening in a terminal cover that exposes a conductor, a terminal, or both to a connector receptor for forming a connection between two or more photovoltaic components.

The terminal covers may function to cover an end of a connector. The terminal covers may function to protect one or more conductors of a connector. The one or more terminal covers may function to create a connection port, may include a connection port, or both. The terminal covers may be any device and/or feature that covers all or a portion of the connector, the ends of the connector, the internal components, a terminal, or a combination thereof. The terminal cover may be any device and/or feature that forms a seal with the housing, forms a sealed connection with the one or more connector receptors, or both. The terminal cover may be a rigid cover that protects the internal components, the terminals, the conductors, or a combination thereof. The terminal cover may be flexible so that when a connection is formed the terminal cover is deformed by the connector receptor so that a sealed connection is formed. Preferably, the terminal cover is substantially rigid. The terminal covers may sufficiently cover one or more conductors, one or more conductors, or both so that the connector is safe to the touch; a body part of the user cannot contact a terminal, a conductor, or both; a user is insulated from contacting a part of the connector that is electrically connected; or a combination thereof. The terminal cover may have one or more connection ports that are sufficiently small so that a user cannot contact an electrified part but not so small that an electrical connection cannot be formed. Preferably, the terminal cover protects the conductors and terminals from direct contact by a user, from current leakage, a short circuit, or a combination thereof. The terminal cover may be made of the same material or a different material as the housing. The terminal covers may partially and or fully surround an end of the connector, the connection port, or both. The terminal cover may be flat on all sides, may include one or more tracks on one or more sides and/or edges (e.g. a recess that receives a locating feature of the housing), may include a locating feature (e.g., a piece that projects out) on one or more sides and/or edges, may include an alignment feature that corresponds with a feature of the photovoltaic component and/or connector channel, or a combination thereof so that the terminal cover assists in forming a proper electrical connection during installation, the terminal covers can only be installed in one way, maintain polarity integrity (e.g., negative terminals to negative terminals), or a combination thereof.

The one or more locating features may function to extend into a channel of the housing. The locating feature may function to orient the terminal cover so that the terminal cover can only be connected to the housing in a single configuration. The one or more locating features may laterally align, longitudinally align, or both the terminal cover within the housing. The one or more locating feature may fit between one or more guides, one or more locators (i.e., top locator, bottom locator, or both), or both. Two or more locating feature may extend around a guide, a locator, or both. For example, a primary locating feature may extend on a first side of a guide and a secondary locating feature may extend on a second side of the guide and the locating features may prevent the terminal cover from moving relative to the guide. The one or more locating features may fit within a channel and slide within the channel so that the terminal cover is oriented within the housing, locked within the housing, or both. The one or more locating features may project from the terminal cover. The one or more locating features may be free of communication with a channel. The one or more locating features may be located from one or more sides of the terminal cover, one or more edges of the terminal cover, or both. Preferably, the locating features may be located on opposing edges of the terminal cover and from a single side of the terminal cover. The terminal cover may include one or more and preferably a plurality of locating features. The terminal cover may include one or more primary locating features. The terminal cover may include one or more secondary locating features. The primary locating features may be larger than secondary locating features. The primary locating features may be located at an external location or be exposed to an external location. The primary locating features may prevent movement of the terminal cover relative to the top housing, the bottom housing, or both. The primary locating feature may prevent lateral movement of the terminal cover relative to the top housing, the bottom housing, or both. The secondary locating features may be located in an internal location or be exposed to an internal location. Two or more internal locating features may work in conjunction to prevent the terminal cover from being removed from the housing. Two or more internal locating features may extend between the top housing and the bottom housing. The terminal cover may include one or more locking features that are located proximate to the one or more locating features.

The locking feature may function to assist in forming an electrical connection, a physical connection, or both between the connector and one or more photovoltaic components. The locking feature may be an integral part of the terminal cover, a discrete part, a removable piece, or a combination thereof. The locking feature may be part of the housing. The locking feature may form a connection with a latching mechanism of the photovoltaic component. The locking feature may be a complementary device and/or feature to the latching mechanism. The locking feature may be any device and/or feature that is an opposite to that of the latching mechanism. For example, if the latching mechanism is a male piece then the locking feature is a female piece or vice versa. The locking feature may grip a portion of the photovoltaic component and may form a connection without being connected to the latching mechanism. The locking feature may be any device and/or feature that when connected requires a tool and/or user interface to remove the connection, produces a connection with sufficient force that a tool and/or user interface is required to remove the connection, or both. For example, a screwdriver may be required to disconnect the locking feature from a latching mechanism, or vice versa. The locking feature may produce a connection with sufficient force so that inadvertent disconnection is substantially prevented and/or eliminated. The locking feature may produce a connection with sufficient force so that partial engagement is not achieved. For example, if a user pushes the locking feature partially into contact with the latching mechanism and a connection is not achieved the locking feature and/or latching mechanism may complete the connection so that a connection is formed, the locking feature and/or latching mechanism may remove the partial connection so that no connection is formed, or both. The locking feature may produce a signal when a complete lock is formed (e.g., an audible signal, a haptic signal, or both). Any of the features discussed herein for a locking mechanism may be used for the locking feature. The locking feature may include one or more locking features.

The one or more locking features may function to lock two or more components together. The one or more locking features may function to prevent removal of a connection from a pv laminate connector, a terminal cover from a housing, or both. The one or more locking features may removably connect two or more components together. The one or more locking features may extend from opposing sides of the connector, the terminal cover, the ends of the connector, or a combination thereof. The one or more locking features may require a tool to be removed. The one or more locking features may have elastic characteristics. For example, the locking features may deform inward during creation of a connection and then extend outward once the locking feature is in its locking position. The one or more locking features may deform inwards, deform outwards, or both. Preferably, the one or more locking features may elastically deform. The locking feature may assist in connecting a seal to the terminal cover, retaining a seal on the terminal cover, or both. The one or more locking features may include one or more locking tabs.

The one or more locking tabs may function to restrict movement, form a connection with a latching mechanism, extend into a recess, extend over another component, or a combination thereof. The one or more locking tabs may function to extend outward from the locking feature so that the locking tabs contact another structure to restrict movement. The one or more locking tabs may include a chamfer, a one way piece, or both. For example, the locking tab may be extended in a first direction and the locking tab may prevent the locking tab from being moved in a second direction that is opposite the first direction. The one or more locking tabs may prevent removal without a tool. The one or more locking tabs may assist in retaining one or more seals on the terminal cover.

The one or more seals may function to prevent fluid from entering the connector, the housing, the terminal covers, or a combination thereof. The seal may function to prevent fluid from entering a location proximate to two or more joining surfaces. For example, the seals may prevent fluid from entering the connection at a location proximate to the housing, terminal cover interface. The seals may be an inner seal, an outer seal, or a combination thereof. The seal may be any device and/or feature that covers all or a portion of the terminal cover (i.e., outer seal), is located within the terminal cover (i.e., inner seal), or both and prevents fluids from entering the terminal cover, entering a connection between the terminal cover and the flexible housing, entering a connection between the connector receptor and the terminal cover, forms an insulator around the discrete ends of the connector, or a combination thereof. Preferably each end of the connector includes one outer seal and one inner seal although a plurality of seals may be provided in each location. The seal may be rigid, flexible, expandable, contractible, may release a dielectric gel or potting agent (e.g., an epoxy and/or adhesive), or a combination thereof. For example, the seal may include a dielectric gel and upon installation the dielectric gel and/or potting agent may be released forming a seal between the photovoltaic component and the connector. Preferably, the seal may be a piece that is expandable and contractible so that when an end of the terminal cover extends into the connector receptor the seal contracts and forms a fixed connection therebetween. One or more outer seals may extend around an outer periphery of the terminal cover, one or more inner seals may be an internal component in the terminal cover, or both. The one or more outer seals may include a through hole. The through hole of the outer seals may receive the terminal cover. The one or more outer seals may be elastic so that the outer seal is compressible when a connection is formed between a connector and a pv laminate connector. The one or more inner seals may include one or more through holes. The one or more inner seals may include through holes that receive conductors, a terminal of a conductor, or both. The one or more inner seals may extend into a terminal cover. The one or more inner seals may include a portion that extends over the locking feature, the locking tab, or both. The one or more inner seals may have a generally FIG. 8 shape. The one or more inner seals may surround a portion of the conductors. The one or more inner seals may extend into a terminal cover and the terminal so that the fluid is prevented from extending into the connector through the connection port. The seal may be an integral part of the terminal cover or a discrete part. The seal may be located within the connector receptor, within the photovoltaic module, proximate to the connection points, within the photovoltaic module so that the seal surrounds a portion of the connector when the connector is inserted into the photovoltaic components, or a combination thereof. The one or more inner seals, one or more outer seals, or both may be made of the same material. The material of the inner seals, the outer seals, or both may be made of and/or include an elastomer, an elastomeric material, rubber, an insulating material, a silicon rubber, a rubber with a Durometer of about 30, a rubber with a Durometer of about 50. or a combination thereof. The inner seal, the outer seal, or both may have a Durometer hardness of about 10 or more, about 20 or more, preferably about 30 or more, about 40 or more, about 50 or more, or even about 60 or more. The inner seal, the outer seal, or both may have a Durometer hardness of about 100 or less, 90 or less, or about 80 or less. The inner seal may be softer than the outer seal. The inner seal may have a Durometer hardness of about 30 or more. The outer seal may have a hardness that is sufficiently high that the outer seal does not fold, is prevented from folding, retains its shape, or a combination thereof. The outer seal may have a hardness so that the outer seal retains its shape, bunching is prevented, or both during connection with a photovoltaic component. The outer seal may have a Durometer hardness of about 50 or more. The one or more outer seals, one or more inner seals, terminal cover, or a combination thereof may cover the one or more terminals, provide a fluid barrier around the one or more terminals, or both.

The one or more terminals may function to allow electricity to flow through a connector, from one photovoltaic component to another photovoltaic component, or both. The one or more terminals may be any part of the connector that forms an electrical connection with the connector receptor so that two or more adjacent photovoltaic components are electrically connected, so that power is transferred from one photovoltaic component to another photovoltaic component, so that a connection is formed between a conductor in the connector and a conductor within the photovoltaic component, or a combination thereof. The one or more terminals may be an end of a conductor. The one or more terminals may be a part of the conductor that extends into the connector receptor, that a portion of the connector receptor extends into, or both so that an electrical connection is formed. The one or more terminals may have an end that grips the conductor, an end that grips a portion of the connection receptor, or both. The terminals may be integrally formed with the electrical conductors, may be discrete and added to the electrical conductors, or both. The terminal may be a male component, a female component, or both. The one or more terminals may be a discrete part, an integral part, or a combination of both of the electrical conductor.

The one or more electrical conductors may function to allow power to transfer from a first photovoltaic component to a second photovoltaic component. The one or more electrical conductors may be any device and/or feature that extends between two or more locations so that power is transferred from a first location to a second location. The one or more electrical conductors may be any device and/or feature inside of a connector that assists in transferring electricity between two or more photovoltaic components. Preferably, the connector includes two conductors and the two conductors extend from a first end of the connector to the second end of the connector so that an electrical connection is formed and electricity can flow from the first end to the second end or vice versa. The electrical conductors may have any configuration so long as electricity flows through the one or more electrical conductors from a first photovoltaic component to a second photovoltaic component. The electrical conductors may be flat, round, oval, twisted, straight, include one arcuate portion, include a plurality of arcuate portions, include one or more bends, or a combination thereof. The housing may insulate the electrical conductor. The electrical conductors may be made of any material that conducts electricity. Preferably, the electrical conductors are made of metal. More preferably, the electrical conductors are made of copper, brass, bronze, tin, silver, gold, or a combination thereof. The electrical conductors may be insulated, non-insulated, or a combination of both. The electrical conductors may have two or more connection points, one or more integral parts, one or more parts that are connected, or a combination thereof. The electrical conductors have a height and may have a width (i.e., the conductor is not round). The width of the electrical conductor may be any width so that the electrical conductor may be moved within a plane, out of a plane, or both and the one or more electrical conductors form an electrical connection so that electricity is transferred between two or more photovoltaic components. The width of the one or more electrical conductors may be in one plane as the electrical conductor extends from a first end to a second end. The width of the electrical conductor may extend out of plane (i.e., twist) as the electrical conductor extends from the first end to the second end of the connector. For example, the electrical conductor may begin at a first end so that the width is flat and proximate to a terminal.

A method may be used to assemble a photovoltaic array. The method may include one or more of the following steps performed in virtually any order. Two or more photovoltaic components may be located proximate to each other. The photovoltaic components may be connected directly to a support structure, a roof structure, a roof deck, a roof of a building, a roof of a house, or a combination thereof via a fastener (e.g., nail, screw, bolt, the like, or a combination thereof). A support base of a photovoltaic module may be connected first and then a photovoltaic laminate may be connected to the base plate. The two or more photovoltaic components may be aligned relative to each other, the partial connector channels in the photovoltaic components (i.e., the base plate) may be aligned relative to each other, or both. A connector of the teachings herein may be aligned with the partial connector channels of the photovoltaic components, the full connector channel formed when the two or more photovoltaic components are aligned, or both. The connector may be flexed so that the connector aligns with one or more features (e.g., connector channel, latching mechanism, connector receptors, connection points, or a combination thereof) of the photovoltaic modules, the base plates, or both. The housing may be moved so that the flexible region in the housing assists in producing an electrical connection, a physical connection, or both. A first end of the connector may be located relative to a first photovoltaic component and a second end of the connector may be located relative to a second photovoltaic component. An electrical connection may be formed by moving the connector into a connector channel, a physical connection may be formed by moving the connector into a connector channel, or both. Moving both the first end and the second end simultaneously in a first direction so that both ends form a connection (e.g., physical, electrical, or both) simultaneously. The locking feature, the latching mechanism, or both may be moved so that a physical connection is formed between the locking feature and the latching mechanism. The locking feature, the latching mechanism, or both may be actuated by a hand, a tool, or both so that the locking feature, the latching mechanism, or both are disconnected, the connector may be removed, or both. The connector may be removed from the photovoltaic array without disturbing any of the photovoltaic components, moving any other photovoltaic components, moving any photovoltaic components relative to each other, or a combination thereof.

FIG. 1 illustrates a top perspective view of a photovoltaic array 2. The photovoltaic array 2 includes a plurality of rows of photovoltaic modules 4 that are connected at ends by integrated flashing pieces 60. Each row of photovoltaic modules 4 overlaps an adjacent row of photovoltaic modules so that the connectors are covered. The very top row of photovoltaic modules 4 has exposed connectors 10 that electrically connect a pair of photovoltaic modules 4 together, and include connectors 10 that connect to the photovoltaic modules 4 to integrated flashing pieces 60 so that adjacent rows are electrically connected.

Figure 2:
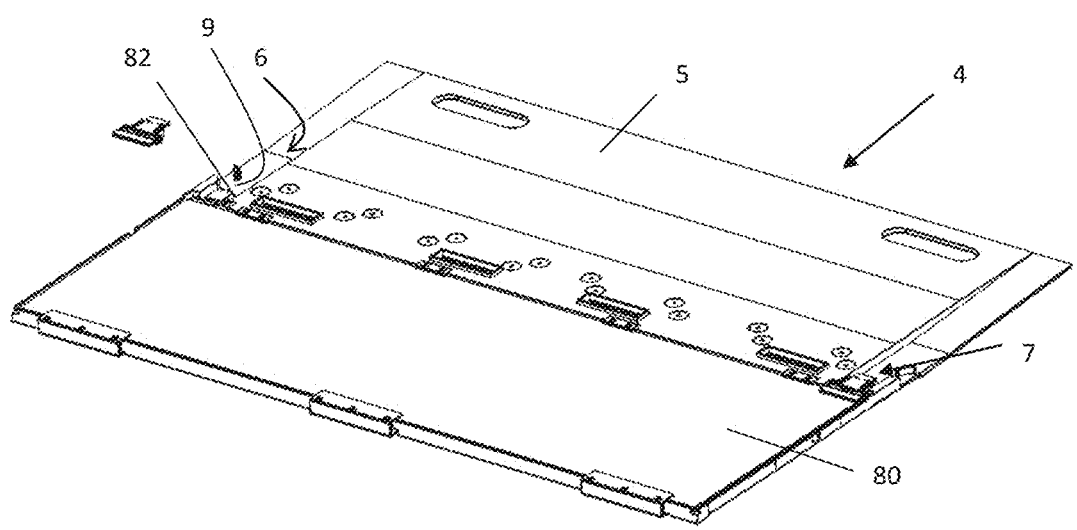
FIG. 2 illustrates a perspective view of a photovoltaic module.

FIG. 2 illustrates a top perspective view of a photovoltaic module 4. The photovoltaic module 4 includes a base plate 5 and a photovoltaic laminate 80 connected to the base plate 5. The photovoltaic laminate 80 includes two opposing photovoltaic laminate connectors 82 (one of which is covered by an integrated frame and one includes the integrated frame removed). When the photovoltaic laminate 80 is connected to the base plate 5 the photovoltaic laminate connector 82 extends into a connector channel 6. The connector channel 6 includes fluid recesses 9 so that fluid can exit the connector channel 6. The photovoltaic laminate connector 82 and the connector recess 6 form a connector receptor 7 that receives and guides the connector (not shown) into contact with the photovoltaic laminate connector 82.

Figure 3:
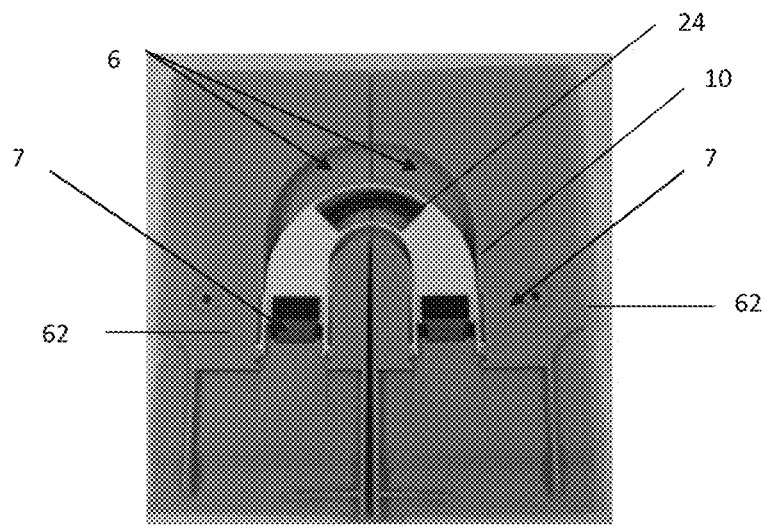
FIG. 3 illustrates a top view of a connector extending between two photovoltaic components.

FIG. 3 illustrates a top view of two adjacent photovoltaic components 62 connected together. The photovoltaic components 62 each include a connector channel 6 that when connected together form a whole connector channel 6 with connector receptors 7 at the ends. A connector 10 with a mechanical flexing region 24 is located within the connector channels 6 and in contact with each of the connector receptors 7. The mechanical flexing region 24 allows the connector 10 to move with the two adjacent photovoltaic components 62 and maintain a connection as the two adjacent photovoltaic components move relative to each other.

Figure 4:
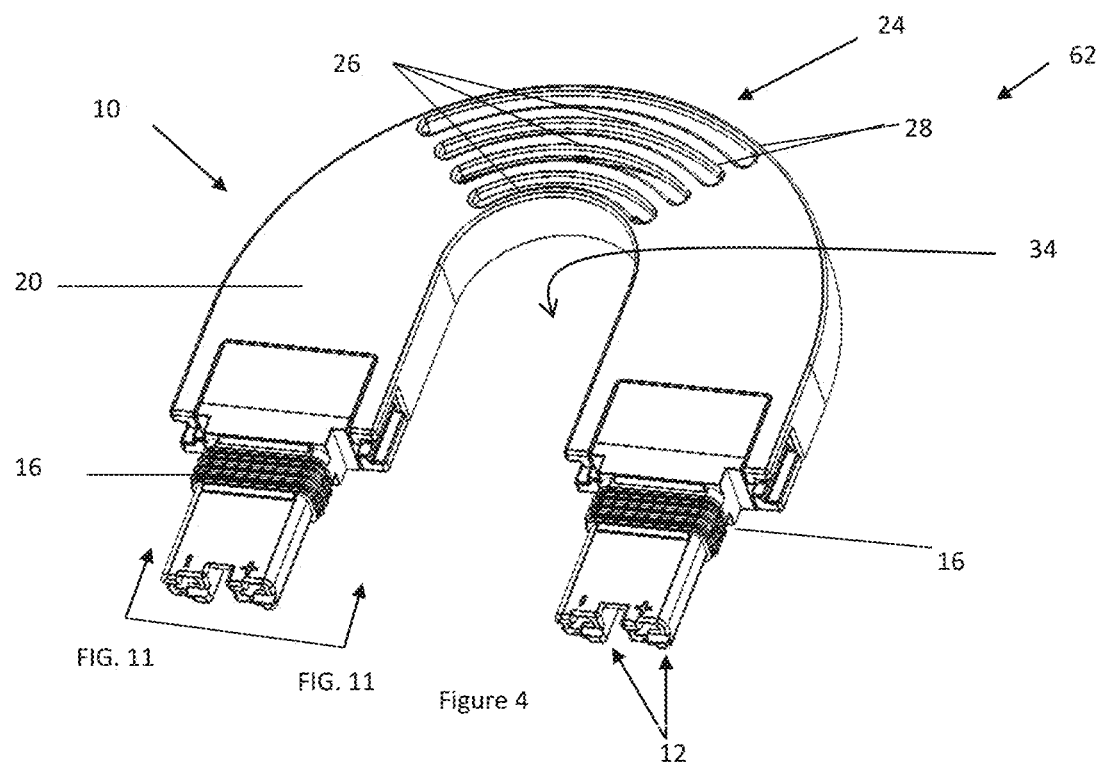
FIG. 4 illustrates a perspective view of a connector.

FIG. 4 illustrates a perspective view of a photovoltaic component 62 which is a connector 10. The connector 10 includes a housing 20 with a mechanical flexible region 24. The mechanical flexible region 24 includes a plurality of ribs 26 and spaces 28 between the ribs 26 that allow the housing 20 to flex. An open section 34 extends through a central portion of the housing 20. The housing includes two ends that each include a connection port 12 for creating an electrical connection. Each of the connection ports 12 include a seal 16 so that when the connector 10 is in communication with an adjacent connector a fluid barrier is created.

Figure 5:
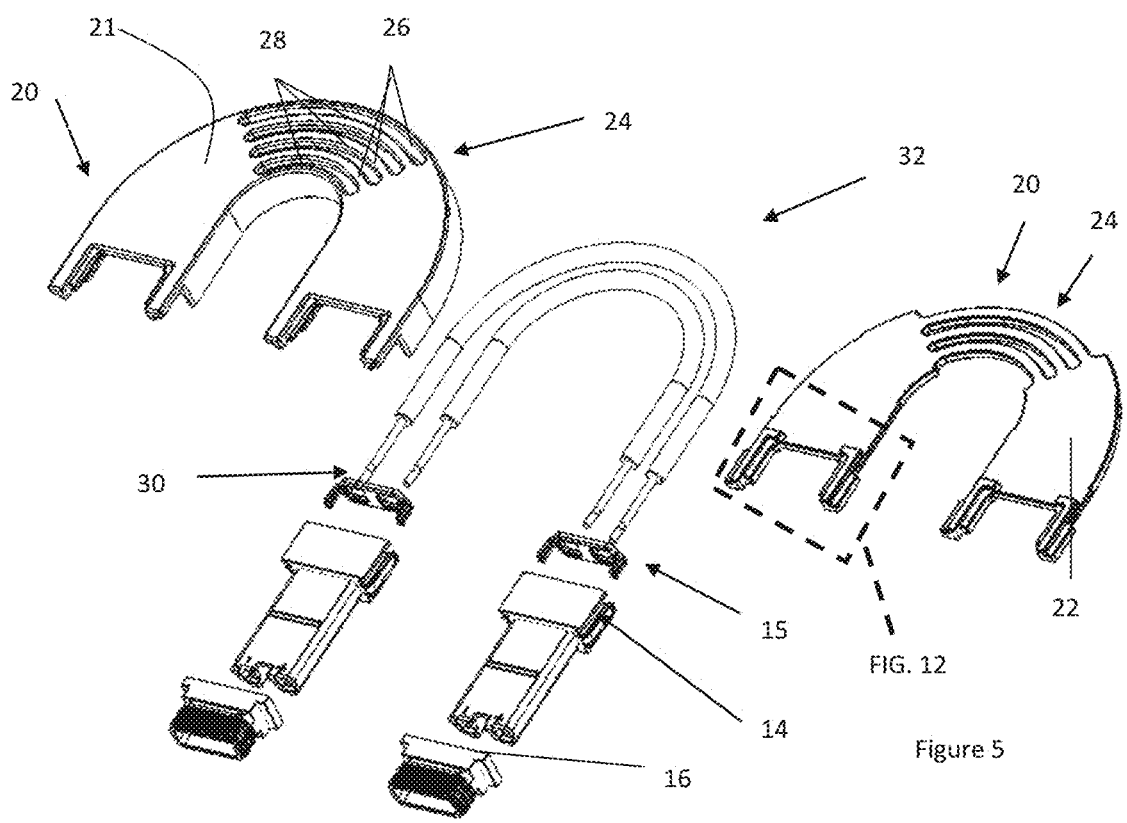
FIG. 5 illustrates an exploded view of the connector of FIG. 4.

FIG. 5 is an exploded view of a connector 10 including a housing 20. The housing includes a top housing 21 and a bottom housing 22 that each include a mechanical flexible region 24. The top housing 21 and the bottom housing 22 connect together around a pair of insulated conductors 32. Ends of the insulated conductors 32 extend into terminal covers 14 forming a terminal 30. The terminal covers 14 include an outer seal 16 for forming a fluid barrier about the terminal cover 14. An inner seal 15 is located on an inside of the terminal cover 14 so that a fluid barrier is created. The housing 20 is rigid and the mechanical flexible regions 24 includes spaces 28 between the ribs 26 for mechanically creating the mechanical flexible regions 24.

Figure 6:
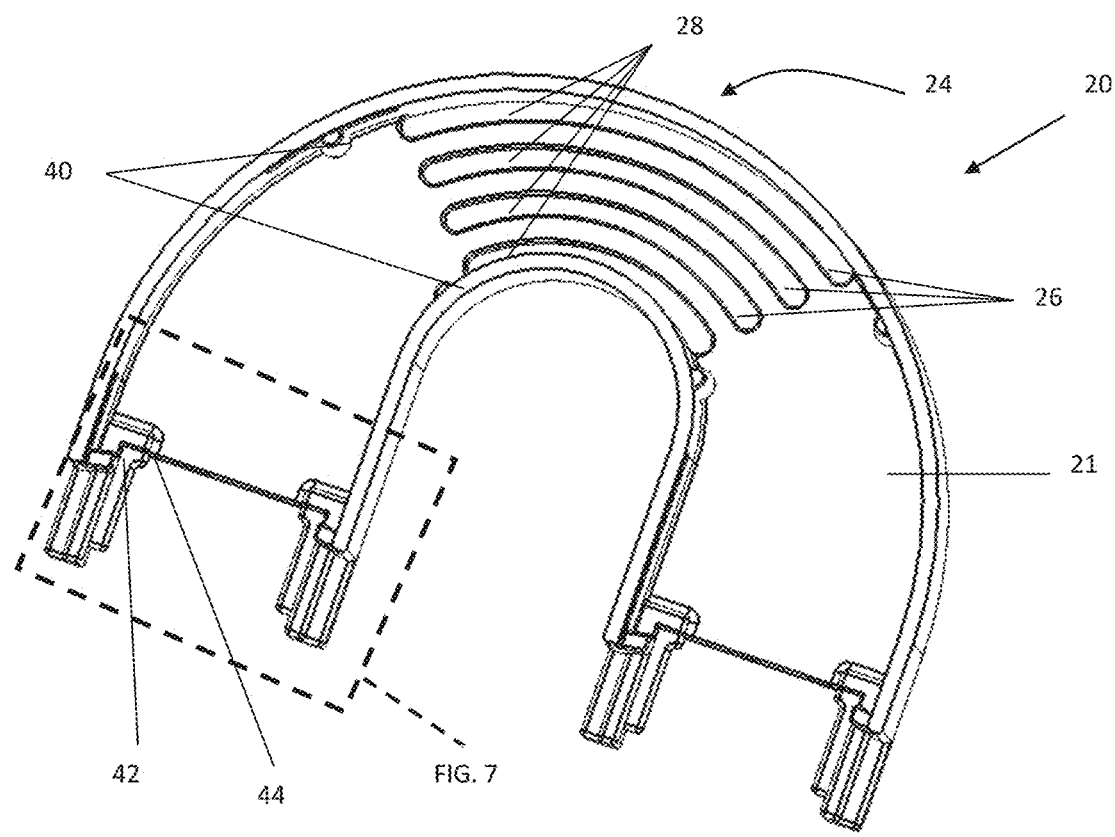
FIG. 6 illustrates a close up view of a flexible region of FIG. 4.

FIG. 6 illustrates a housing 20. The housing 20 is a top housing 21 that includes a mechanical flexing region 24. The mechanical flexible region 24 includes a plurality of ribs 26 and spaces 28 with the ribs 26 and spaces 28 alternating. The top housing 21 also includes stops 40 that prevent the bottom housing (not shown) from being pressed into the top housing when connected. The top housing 21 includes an end locator 42 to prevent removal of a terminal cover (not shown) from being removed from the housing 20. The top housing 21 also includes a guide 44 proximate to the end locator 42. The guide 44 assists a locking feature (not shown) on the terminal cover into the housing so that the terminal cover and the housing 20 are connected.

Figure 7:
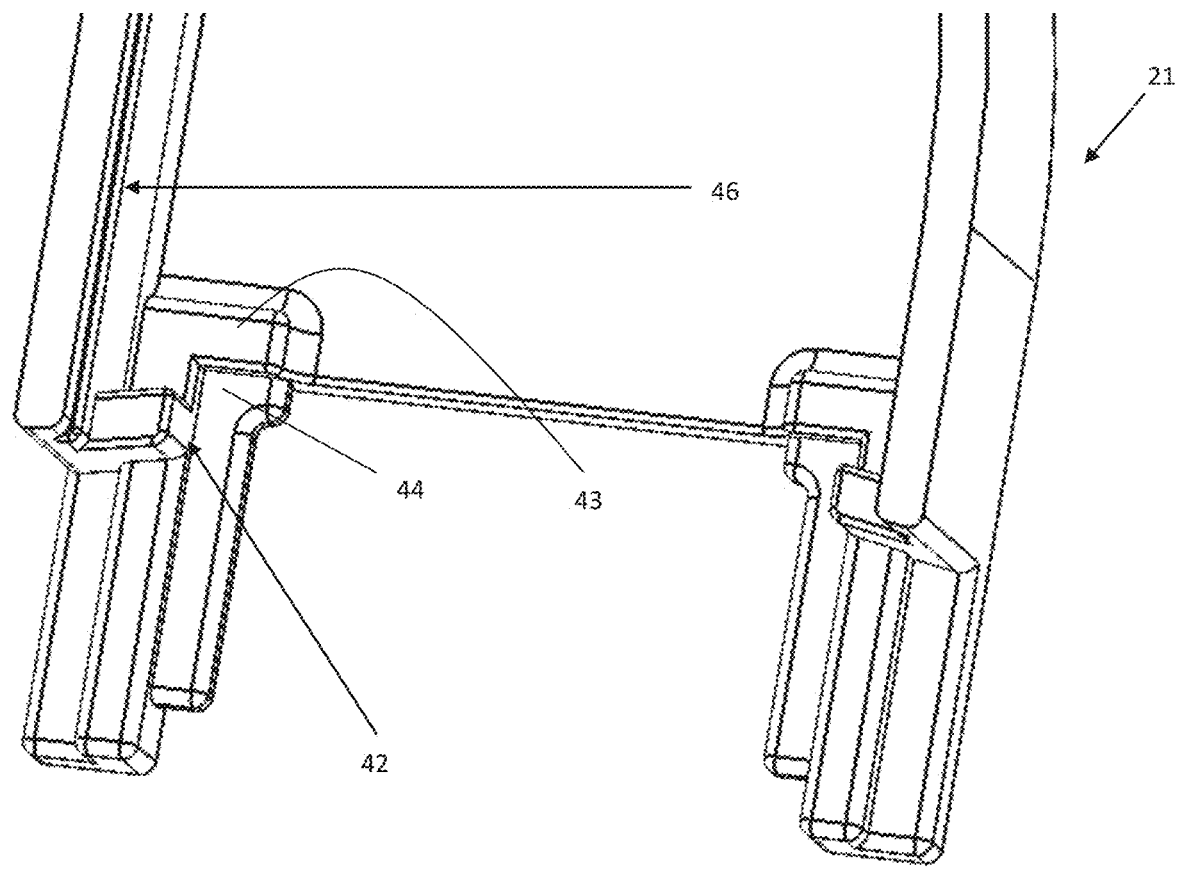
FIG. 7 illustrates a close up view of an end of the top housing of FIG. 6.

FIG. 7 illustrates an end of the top housing 21 (with the other end including all of the same features). The top housing 21 includes a channel 46 that receives a locating feature (not shown) of a terminal cover so that the terminal cover and the top housing 21 are aligned relative to each other. A guide 44 is located proximate to the channel 46 and the guide 44 assists the locking feature (not shown) of the terminal cover in aligning within the top housing 21 so that the lock feature of the terminal cover locks on the end locator 42. The end locator 42 assists in preventing the terminal cover from being removed from the housing once the terminal cover is placed within the housing. A top locator 43 is located opposite the end locator 42 so that a terminal cover (not shown) is prevented from being pushed into the top housing 21 or removed from the top housing 21.

Figure 8:
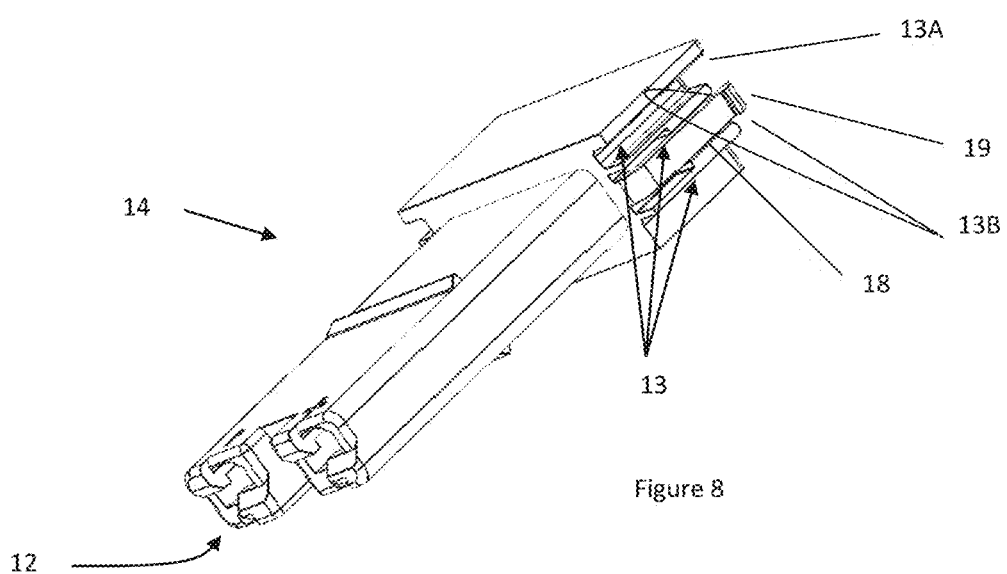
FIG. 8 is a close-up perspective view of a terminal cover.

FIG. 8 illustrates an example of a terminal cover 14. The terminal cover 14 has an end that is a connection port 12 for forming an electrical connection. The terminal cover 14 has locating features 13 that extend off of the terminal cover. The primary location feature 13A extends into a channel (not shown) of the housing. A pair of secondary locating features 13B assist in locating the terminal cover 14 between the top housing 21 and the bottom housing 22. A locking feature 18 extends outward from the terminal cover and includes a locking tab 19 that extends over an end locator 42 so that the terminal cover 14 cannot be removed from the housing.

Figure 9:
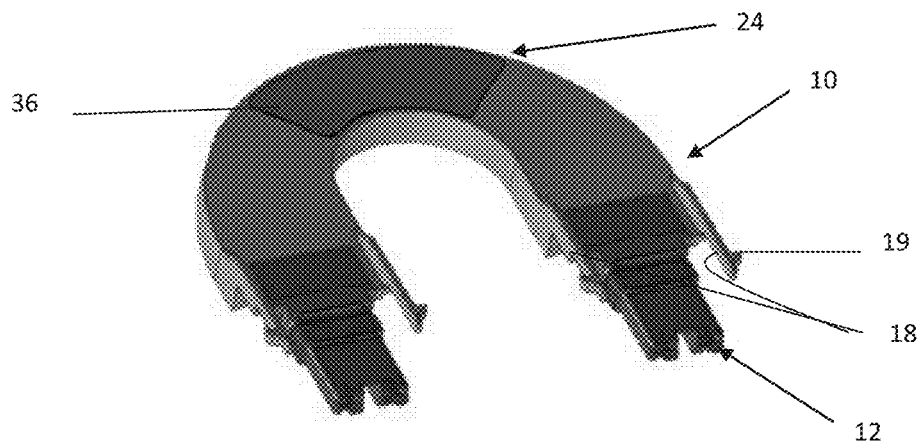
FIG. 9 illustrates a perspective view of a connector.

FIG. 9 illustrates a multi-material connector 10. The connector 10 includes a mechanical flexing region 24 with an elastic piece 36 that allows the connector to move. An end of the connector 10 by the connection port 12 where the connector 10 connects to an adjacent device includes lock features 18 and locking tabs 19 so that a fixed connection is formed.

Figure 10:
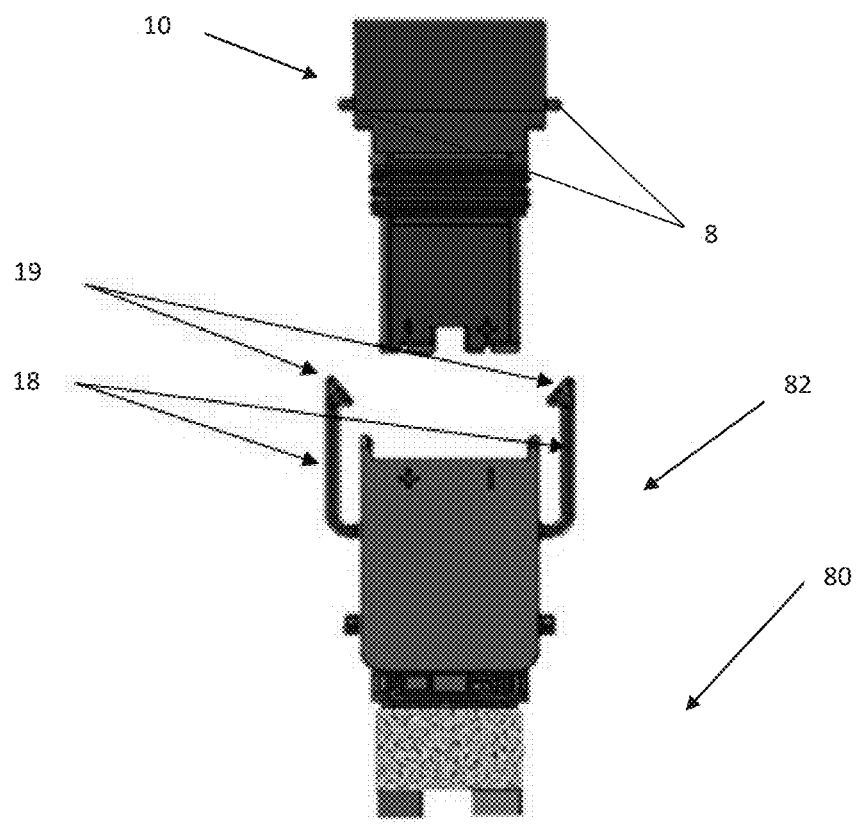
FIG. 10 illustrates a close up view of a connector and a pv laminate connector forming a fixed connection.

FIG. 10 illustrates a connector 10 forming a connection with a pv laminate connector 82. The pv laminate connector 82 is connected to and extending from a pv laminate 80. The pv laminate connector 82 received the connector 10 and includes a pair of opposing locking features 18 with locking tabs 19 that extend over the latching mechanisms 8 of the connector 10 so that a fixed connection is formed.

Figure 11:
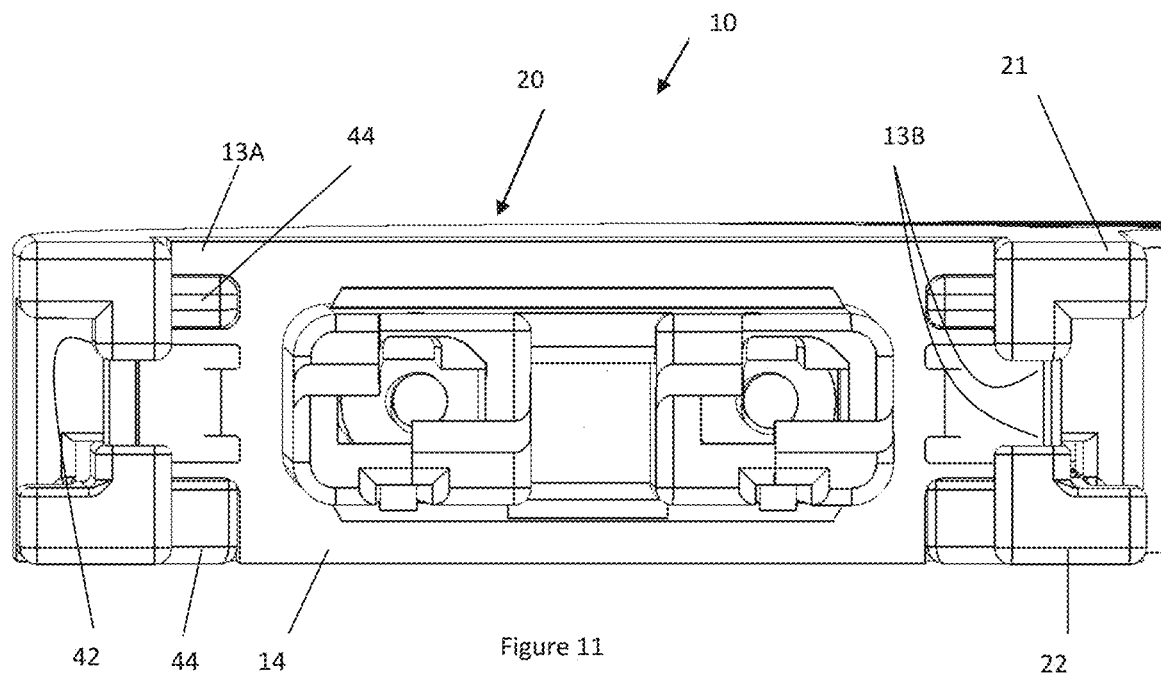
FIG. 11 illustrates a close up view of an end of a connector of FIG. 4 with the outer seals removed.

FIG. 11 illustrates a close-up view of a bottom of the connector 10 with the seals removed. The connector 10 includes a top housing 21 and a bottom housing 22 with a terminal cover 14 sandwiched partially there between. The terminal cover 14 includes a primary locating feature 13A that extends on an outside of a guide 44 and includes a pair of secondary locating features 13B that extend between the guides 44 of the top housing 21 and the bottom housing 22. A locator 42 prevents the terminal cover 14 from being removed from the housing 20.

Figure 12:
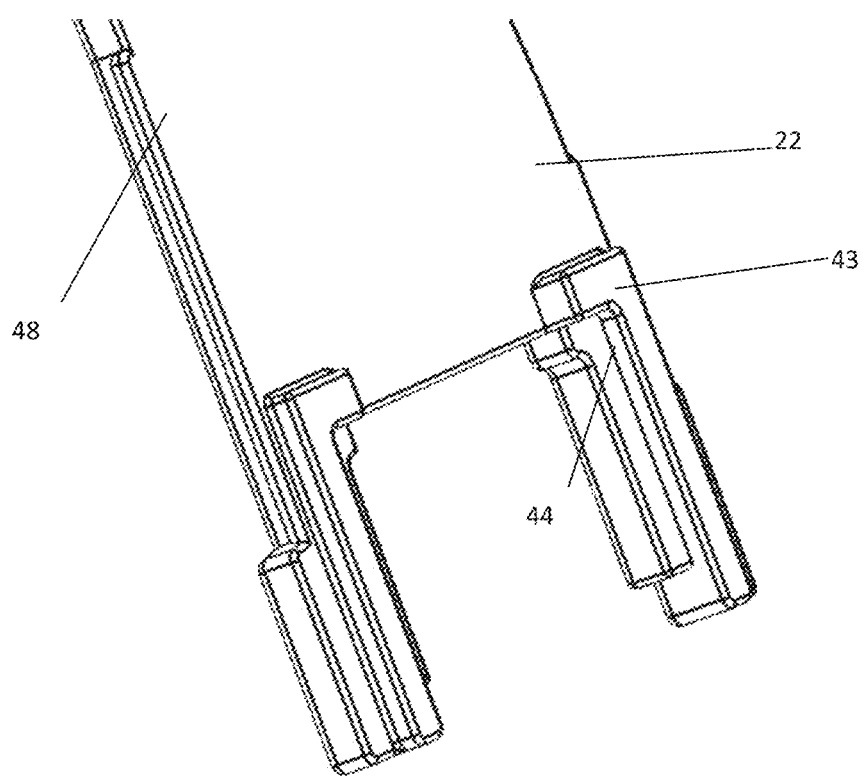
FIG. 12 illustrates a close-up view of an end of the bottom housing.

FIG. 12 illustrates a perspective view of a bottom housing 22. The bottom housing 22 includes a ridge 48 that extends along an edge of the bottom housing and fits within the channel 46 shown in FIG. 7 so that the top housing and bottom housing are connected together. The ends of the bottom housing 22 include a top locator 43 and a guide 44 that are complementary to the top locator 43 and guide 44 of the top housing so that the terminal cover (not shown) is connected therein.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

2—Photovoltaic Array
 3—Photovoltaic Component
 4—Photovoltaic Module
 5—Base Plate
 6—Connector Channel
 7—Connector Receptor
 8—Latching Mechanism
 9—Fluid Drain
 10—Connector
 12—Connection Port
 13—Locating Feature
 13A—Primary Locating Feature
 13B—Secondary Locating Feature
 14—Terminal Cover
 15—Inner Seal
 16—Outer Seal
 18—Locking Feature
 19—Locking Tab
 20—Housing
 21—Top Housing
 22—Bottom Housing
 24—Mechanical Flexing Region
 26—Ribs
 28—Spaces
 30—Terminals
 32—Conductors (Insulated)
 34—Open Sections
 36—Elastic Piece
 40—Stop
 42—End Locator
 44—Guide
 46—Channel
 48—Ridge
 60—Integrated Flashing Pieces
 62—Photovoltaic Component
 80—Photovoltaic Laminate (pv laminate)
 82—Photovoltaic Laminate Connector (pv laminate connector)

We claim:

1. A photovoltaic assembly comprising:
a first photovoltaic component and a second photovoltaic component, wherein the first photovoltaic component and the second photovoltaic component are adjacent to each other, the first photovoltaic component comprising:
 a partial connector channel in communication with a partial connector channel in the second photovoltaic component, and
 one or more connector receptors;
a connector located at least partially in the partial connector channel of the first photovoltaic component and at least partially in the partial connector channel of the second photovoltaic component so that the connector connects the first photovoltaic component to the second photovoltaic component, the connector comprising:
 one or more connection ports at a first end of the connector, each of the one or more connection ports including an alignment feature that cooperates with a shape of the one or more connector receptors of the first photovoltaic component to form a connection between one of the one or more of the connector receptors of the first photovoltaic component and the one or more connection ports at the first end of the connector,
 one or more connection ports at a second end of the connector, each of the one or more connection ports including an alignment feature that cooperates with a shape of the one of more connector receptors of the second photovoltaic component to form a connection between one of the one or more connector receptors of the second photovoltaic component and the one or more connection ports at the second end of the connector,
 a housing that extends between and connects the one or more connection ports at the first end of the one or more connection portions at the second end, the housing having:
  a top housing, and
  a bottom housing, wherein one or more connection ports at the first end of the connector extend from a first end of the housing and the one or more connection ports at the second end of the connector extend from a second end of the housing; and
 one or more flexible electrical conductors located within the housing and extend from the one or more connection ports at the first end to the one or more connection ports at the second end;
wherein:
the top housing and the bottom housing each include one or more mechanical flexing regions that allow the housing to mechanically flex so that the first end of the housing and the second end of the housing are movable relative to each other, the one or more mechanical flexing regions being located between the first end of the housing and the second end of the housing,
the top housing, the bottom housing, or both include one or more channels that receive one or more locating features of a terminal cover so that the terminal cover is aligned relative to the housing, and the top housing, the bottom housing, or both include one or more end locators that prevent the terminal cover from being removed from the housing, the terminal cover including one or more locking features that contact the one or more end locators and prevent the terminal cover from being removed from the housing, and one or more locking tabs extend outward from each locking feature and into contact with the one or more end locators so that the terminal cover is fixedly connected to the housing.

2. The photovoltaic assembly of claim 1, wherein the housing is located within a plane and is formed from a rigid material that is resistant to flexing and the one or more mechanical flexing regions allow the housing to be flexed in the plane.

3. The photovoltaic assembly of claim 1, wherein the one or more mechanical flexing regions include one or more spaces through the top housing, the bottom housing, or both that weaken the housing so that the housing flexes at the one or more mechanical flexing regions.

4. The photovoltaic assembly of claim 3, wherein the one or more spaces are located between one or more ribs that connect the first end of the housing to the second end of the housing.

5. The photovoltaic assembly of claim 1, wherein the one or more mechanical flexing regions are made of a single material.

6. The photovoltaic assembly of claim 1, wherein the one or more mechanical flexing regions include two or more materials and at least one of the materials is a flexible piece.

7. The photovoltaic assembly of claim 1, wherein the top housing, the bottom housing, or both include one or more stops that space the top housing and the bottom housing apart so that the one or more flexible electrical conductors extend therebetween.

8. The photovoltaic assembly of claim 7, wherein the one or more stops prevent the bottom housing from being moved into the top housing so that a space with a substantially constant size is formed that the one or more flexible electrical conductors extend through.

9. A photovoltaic assembly comprising:
a first photovoltaic component and a second photovoltaic component, wherein the first photovoltaic component and the second photovoltaic component are adjacent to each other, the first photovoltaic component comprising:
  a partial connector channel in communication with a partial connector channel in the second photovoltaic component, and
  one or more connector receptors;
a connector located at least partially in the partial connector channel of the first photovoltaic component and at least partially in the partial connector channel of the second photovoltaic component so that the connector connects the first photovoltaic component to the second photovoltaic component, the connector comprising:
  one or more connection ports at a first end of the connector, each of the one or more connection ports including an alignment feature that cooperates with a shape of the one or more connector receptors of the first photovoltaic component to form a connection between one of the one or more of the connector receptors of the first photovoltaic component and the one or more connection ports at the first end of the connector,
  one or more connection ports at a second end of the connector, each of the one or more connection ports including an alignment feature that cooperates with a shape of the one of more connector receptors of the second photovoltaic component to form a connection between one of the one or more connector receptors of the second photovoltaic component and the one or more connection ports at the second end of the connector,
a housing that extends between and connects the one or more connection ports at the first end of the one or more connection portions at the second end, the housing having:
  a top housing, and
  a bottom housing, wherein one or more connection ports at the first end of the connector extend from a first end of the housing and the one or more connection ports at the second end of the connector extend from a second end of the housing; and
  one or more flexible electrical conductors located within the housing and extend from the one or more connection ports at the first end to the one or more connection ports at the second end;
wherein:
the top housing and the bottom housing each include one or more mechanical flexing regions that allow the housing to mechanically flex so that the first end of the housing and the second end of the housing are movable relative to each other, the one or more mechanical flexing regions being located between the first end of the housing and the second end of the housing, and
the top housing, the bottom housing, or both include one or more channels that receive one or more locating features of a terminal cover so that the terminal cover is aligned relative to the housing, and the top housing, the bottom housing, or both include one or more guides at the first end and the second end of the housing and the one or more guides at the first end or the second end of the housing receive a portion of the terminal cover and align the terminal cover within the first end or the second end of the housing.

10. A photovoltaic assembly comprising:
a first photovoltaic component and a second photovoltaic component, wherein the first photovoltaic component and the second photovoltaic component are adjacent to each other, the first photovoltaic component comprising:
  a partial connector channel in communication with a partial connector channel in the second photovoltaic component, and
  one or more connector receptors;
a connector located at least partially in the partial connector channel of the first photovoltaic component and at least partially in the partial connector channel of the second photovoltaic component so that the connector connects the first photovoltaic component to the second photovoltaic component, the connector comprising:
  one or more connection ports at a first end of the connector, each of the one or more connection ports including an alignment feature that cooperates with a shape of the one or more connector receptors of the first photovoltaic component to form a connection between one of the one or more of the connector receptors of the first photovoltaic component and the one or more connection ports at the first end of the connector,
  one or more connection ports at a second end of the connector, each of the one or more connection ports including an alignment feature that cooperates with a shape of the one of more connector receptors of the second photovoltaic component to form a connection between one of the one or more connector receptors of the second photovoltaic component and the one or more connection ports at the second end of the connector, a housing that extends between and connects the one or more connection ports at the first end of the one or more connection portions at the second end, the housing having:
a top housing, and
a bottom housing, wherein one or more connection ports at the first end of the connector extend from a first end of the housing and the one or more connection ports at the second end of the connector extend from a second end of the housing; and one or more flexible electrical conductors located within the housing and extend from the one or more connection ports at the first end to the one or more connection ports at the second end;

wherein:
the top housing and the bottom housing each include one or more mechanical flexing regions that allow the housing to mechanically flex so that the first end of the housing and the second end of the housing are movable relative to each other, the one or more mechanical flexing regions being located between the first end of the housing and the second end of the housing, and the top housing, the bottom housing, or both include one or more channels that receive one or more locating features of a terminal cover so that the terminal cover is aligned relative to the housing, and an inner seal is located within the terminal cover and an outer seal extends around an outside of the terminal cover so that a seal is formed between the housing and the terminal cover.

* * * * *